US005475814A

United States Patent [19]
Tomimitsu

[11] Patent Number: 5,475,814
[45] Date of Patent: Dec. 12, 1995

[54] SELF DIAGNOSIS OF A SCSI CONTROLLER THROUGH AN I/O PORT FOR DATA TRANSMISSION/DATA RECEPTION MODES OF OPERATION

[75] Inventor: Yasuharu Tomimitsu, Tokyo, Japan

[73] Assignee: NEC Corporation, Tokyo, Japan

[21] Appl. No.: 51,220

[22] Filed: Apr. 23, 1993

[30] Foreign Application Priority Data

Apr. 24, 1992 [JP] Japan ................................. 4-107075

[51] Int. Cl.$^6$ ................................................. G06F 13/00
[52] U.S. Cl. ................. 395/183.06; 395/431; 364/238.3; 364/DIG. 1
[58] Field of Search ............................. 395/425, 183.06; 364/200 MS File, 900 MS File, 238.3; 371/21.2, 67.1, 68.1, 68.2, 16.1, 20.1, 20.5, 23, 34, 22.6

[56] References Cited

U.S. PATENT DOCUMENTS

| | | | |
|---|---|---|---|
| 4,965,801 | 10/1990 | DuLac | 371/40.1 |
| 5,033,049 | 7/1991 | Keener et al. | 371/23 |
| 5,159,671 | 10/1992 | Iwami | 395/250 |
| 5,237,660 | 8/1993 | Weber et al. | 395/250 |
| 5,255,136 | 10/1993 | Machado et al. | 360/77.02 |
| 5,291,584 | 3/1994 | Challa et al. | 395/500 |
| 5,297,067 | 3/1994 | Blackborow | 364/708.01 |
| 5,307,491 | 4/1994 | Feriozi et al. | 395/700 |
| 5,357,519 | 10/1994 | Martin et al. | 371/15.1 |

Primary Examiner—Tod R. Swann
Assistant Examiner—Frank J. Asta
Attorney, Agent, or Firm—Foley & Lardner

[57] ABSTRACT

An I/O port enable to intercept the SCSI communications between a SCSI control circuit and host system regardless at the data transmission mode or at data reception mode. When the SCSI communications are intercepted, a system controller transfers data from a main memory to a buffer memory through the SCSI control circuit at the data transmission mode of the SCSI control circuit and performs the self-diagnosis of the SCSI control circuit by comparing data transmitted to the buffer memory with the test data stored in the main memory. At the data reception mode of the SCSI control circuit, the system controller stores data read from the main memory to the buffer memory through the buffer memory control circuit and performs the self-diagnosis of the SCSI control circuit by comparing data read from the I/O port with data stored in the main memory. Thus, it is possible to vest the self-diagnosis function to the disk control system comprising the SCSI control circuit as the communicating means with the host system so that to improve its liability.

11 Claims, 3 Drawing Sheets

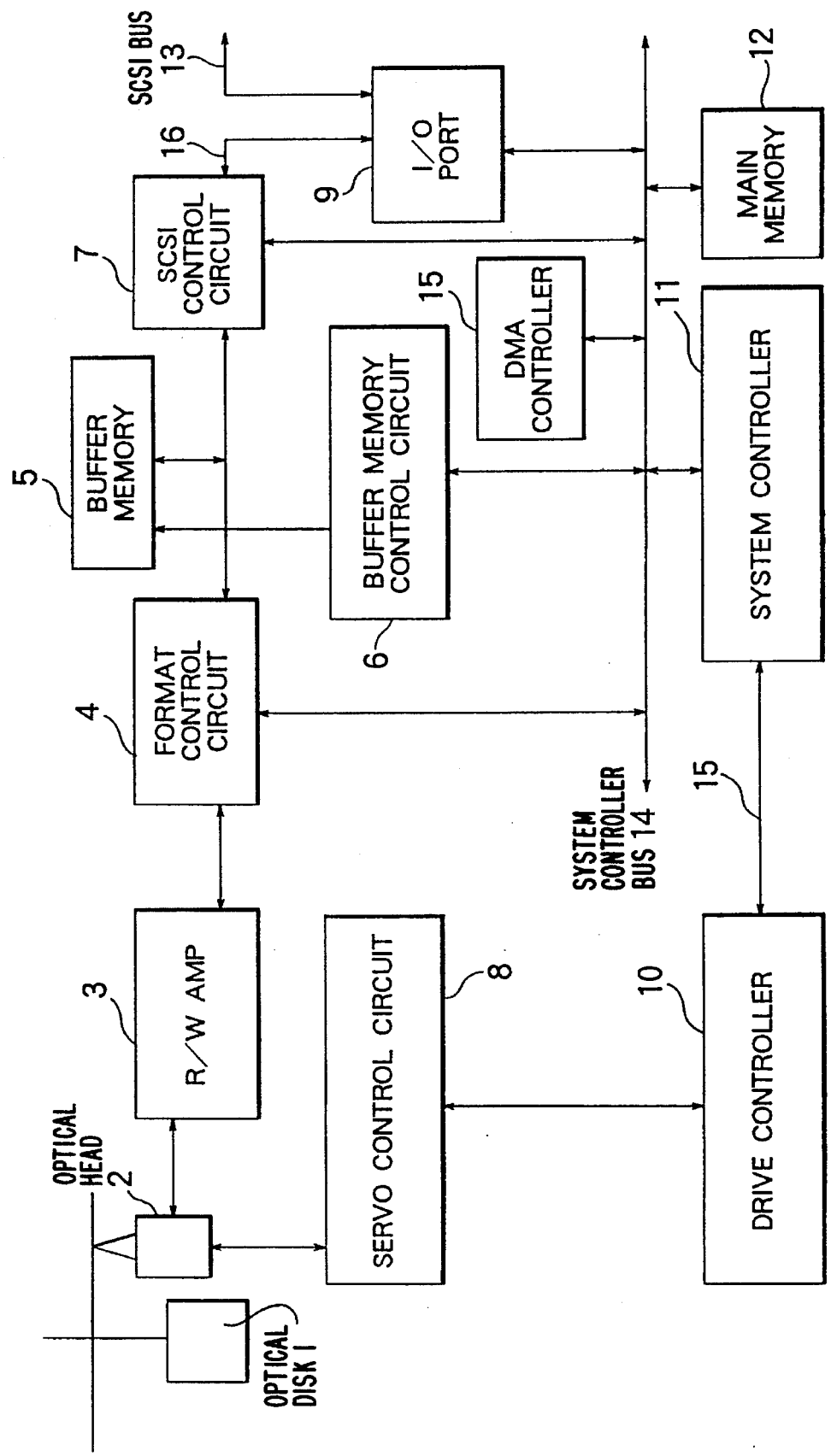

SELF DIAGNOSIS OF A SCSI CONTROLLER THROUGH AN I/O PORT FOR DATA TRANSMISSION/DATA RECEPTION MODES OF OPERATION

BACKGROUND OF THE INVENTION

1. Field of the Invention

The present invention relates to a disk control system comprising a small computer system interface (SCSI) control circuit as communicating means between a magnetic disk, an optical disk or the like and a host system, thereby transferring and receiving data to and from a magnetic disk system, an optical disk system and the like.

2. Description of the Prior Art

FIG. 1 is a block diagram showing a prior art disk control system. This disk control system comprises a SCSI control circuit for an optical disk.

In this disk control system, an optical head 2 reads out data written on an optical disk 1 and also writes data on the optical disk 1. The optical disk 1 is rotated by an appropriate driving device. R(Read)/W(Write) amplifier 3 amplifies data signals detected by the optical head and outputs this amplified signals to a format control circuit 4 RIN amplifier 3 also amplifies the output signals from the format control circuit 4 and outputs the amplified signals to the optical head 2. The format control circuit 4 receives signals from the R/W amplifier 3 and detects the desired sector by reading the ID (address information for the sector) recorded on the top of each sector of data written on the surface of the optical disk 1. To a bus connecting this format circuit 4 and the SCSI control circuit 7 is connected a buffer memory 5 which temporarily stores various data. This buffer memory 5 is controlled by a buffer memory control circuit 6.

The SCSI control circuit 7 transmits and receives data to and from a host system and the like through the SCSI bus 13. A servo control circuit 8 controls the position of the optical head 2 relating to the optical disk 1. The servo control circuit 8 is controlled by a drive controller 10.

The SCSI control circuit 7, buffer memory control circuit 6 and format control circuit 4 are connected to a system controller bus 14. The system controller 11 comprising a microprocessor communicates with the host system through the SCSI bus 13 and the SCSI control circuit 7 and is connected to both the buffer memory control circuit 6 and the format control circuit 4 through the system controller bus 14 system controller 11 is also connected to the drive controller 10 through bus 15. The system controller 11 controls the center disk control system through the system controller bus 14 according to a command from the host system. Also, a main memory 12 is connected to the system controller bus 14 and stores various data input through this system controller bus 14.

The operation of the prior art disk control system constructed as aforementioned will be described. When a command for data write is input to the SCSI control circuit 7 through the SCSI bus 13, the write command is transferred to the system controller 11 through the system controller bus 14. Then, the system controller 11 commands the drive controller 10 to move to the track at the desired position to initiate the write operation in the optical disk 1 (hereinafter referred to as seek). Simultaneously, the system controller 11 sets up the addressing and the like in the buffer memory 5 for the buffer memory control circuit 6 and the data input-output mode with the host system for the SCSI control circuit 7. Data transferred from the host system is temporarily stored in the buffer memory 5 by the SCSI control circuit 7.

Once the format control circuit 4 detects the desired sector by reading the ID placed on the top of each sector in the optical disk 1 through the optical head 2 and the R/W amplifier 3, the system controller 11 reads data stored in the buffer memory 5 and conducts the addition and modulation of synchronization pattern. These data are written in the optical disk 1 through the R/W amplifier 3 and the optical head 2.

In the case of a command for a data read operation input to the SCSI control circuit 7 through the SCSI bus 13, this data read command transferred to the system controller 11 through the system controller bus 14. Then, the system controller 11 commands the drive controller 10 to seek the appropriate track to initiate the read operation from the optical disk 1. Simultaneously, the system controller 11 commands the buffer memory control circuit 6 to set the addressing of read and the like in the buffer memory 5 and awaits.

Once the format control circuit 4 detects the desired sector by reading the ID placed on the top of each sector from the optical disk 1 through the optical head 2 and the R/W amplifier 3, the system controller 11 reads data of that sector and writes it in the buffer memory 5. The SCSI control circuit 7 transfers all data stored in the buffer memory 5 to the host system through the SCSI bus 13.

In the prior art disk control system constructed as mentioned above, faulty articles can occur during manufacturing process as well as after shipped to the market. According to the recent trend of miniaturizing the magnetic disk system and the optical disk system, it is difficult to identify its faulty point or block if such fault occurred in its disk control system.

Therefore, at most the disk control systems recently developed have a built-in self diagnostic function. For example, in order to conduct the diagnosis of the built-in memories, such disk control system is constructed to confirm the normality of its functioning by allowing to execute the write and read commands. In addition, the diagnosis of the data transfer functions is confirmed by transferring data previously stored in a memory for the diagnosis of the data transfer functions from one to another memories (DMA operation) and reading transferred data. Furthermore, in order to conduct the diagnosis of the error correcting circuit, it is confirmed that generated code is normal by inputting a selected sector data and executing the code generation command for the sector data. Such disk control system has also the self-diagnostic functions to perform the diagnostic of error correction by generating incorrect data in relation to the sector data including generated code. These self-diagnosis functions are usually performed immediately after power on or according to a requirement from the host system.

In the prior art disk control system, these self-diagnostic functions enables the system to manufacturing for faults and to easily correct such faults during the manufacturing process and after being shipped to the market.

The prior art disk control systems aforementioned, however, have a defect that abnormalities in the SCSI control circuit 7, if any, can not be detected because they are not installed with the self-diagnostic function for the SCSI control circuit as communicating means with the host system.

SUMMARY OF THE INVENTION

The object of the present invention is to provide a disk control system comprising a SCSI control circuit as communicating means with a host system, wherein a self-diagnostic function for said SCSI control circuit is installed in order to construct a reliable disk system.

The disk control system according to the present invention perform data exchange between the host system and a magnetic disk, optical disk or the like. And, this disk control system comprises a SCSI (Small Computer System Interface) control circuit which performs the SCSI communication with the host system, and input/output (hereinafter referred to I/O) means which enable to intercept the communication between said SCSI control circuit and the host system either at the data transmission mode or at the data reception mode and functions as the input/output circuit for said SCSI control circuit when the communication is intercepted.

The disk control system is provided with a first memory device and a second memory device. Diagnostic means set up the SCSI control circuit to the data transmission mode, transfer data stored in the first memory device to the second memory device through said SCSI control circuit when the SCSI communication with the host system is intercepted and compare data transferred to the second memory device with one stored in the first memory device. Said diagnostic means also set up said SCSI control circuit to the data reception mode, transmit data stored in the second memory device to the first memory device through said SCSI circuit when the SCSI communication with the host system is intercepted and compare data transferred to the first memory device with one stored in the second memory device.

According to the present invention, the diagnostic means compare data transferred through the SCSI control circuit with the original data as mentioned above and enable to judge whether the SCSI control circuit is normally operated or not based on this comparison, therefore the disk control system according to the present invention is capable of performing the self-diagnosis of the SCSI control circuit. In this aspect, the present invention is able to provide a highly reliable disk device.

BRIEF DESCRIPTION OF DRAWINGS

FIG. 3 is a block diagram showing a disk control system according to a second embodiment of the present invention:

DETAILED DESCRIPTION OF THE PREFERRED EMBODIMENTS

Figure 1:
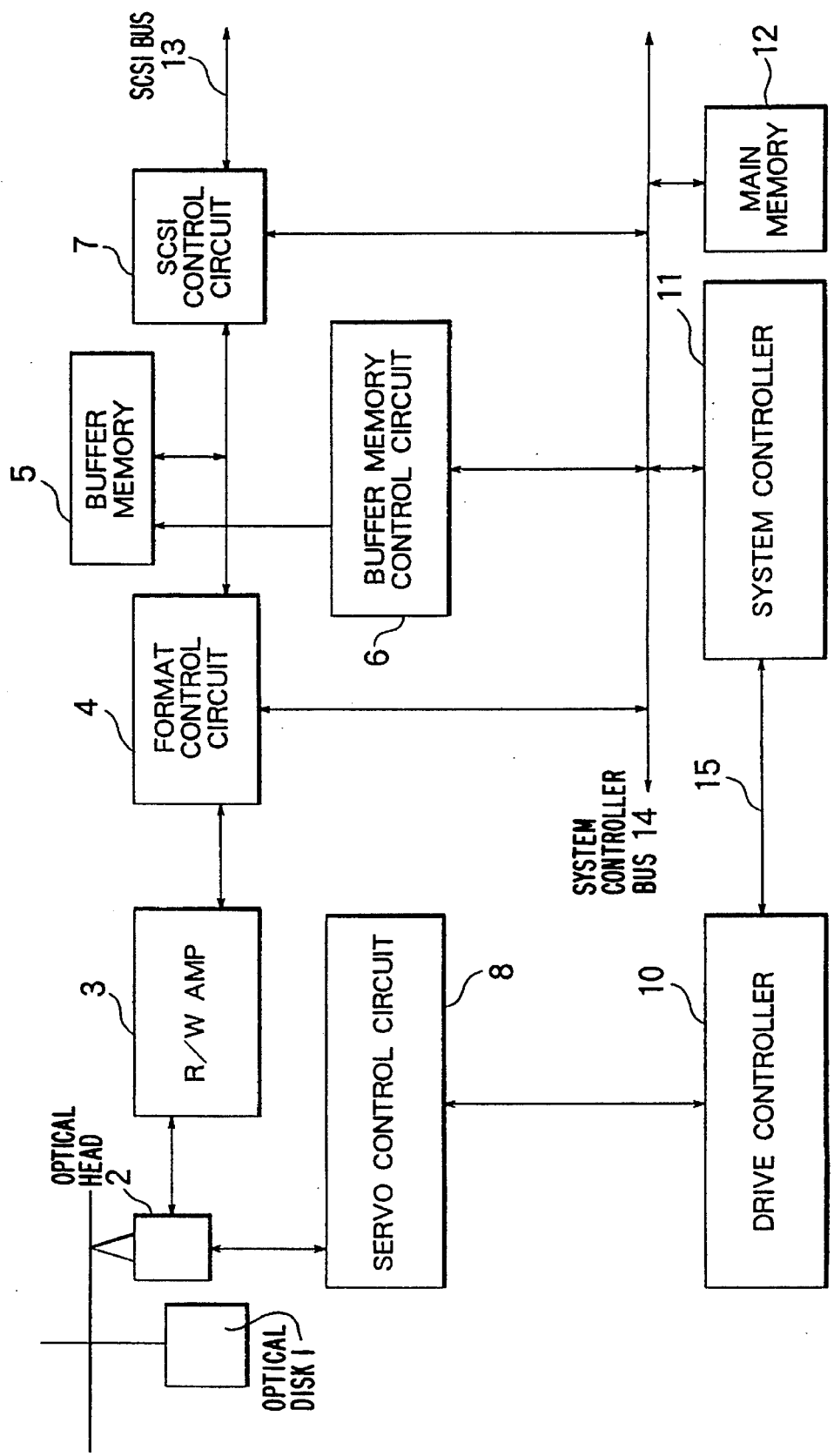
FIG. 1 is a block diagram showing a prior art disk control system.
Figure 2:
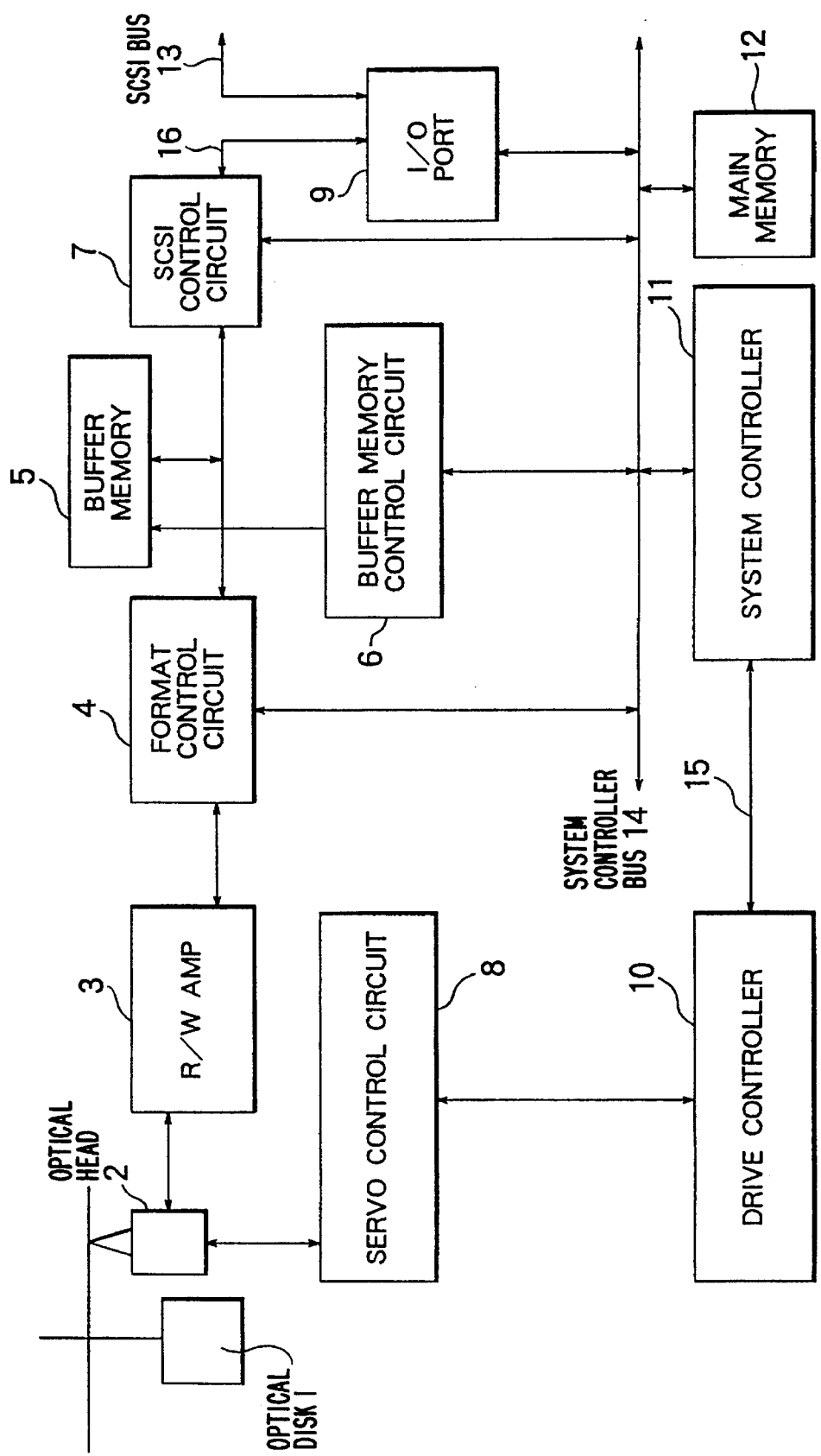
FIG. 2 is a block diagram showing a disk control system according to a first embodiment of the present invention.

The present invention will be described referring drawings as follows. FIG. 2 is a circuit diagram showing a disk control system according to a first embodiment of the present invention. The disk control system shown in FIG. 2 is one embodiment of the optical disk control system to read and write data for a optical disk, but a circuit equivalent to that shown in FIG. 2 can be constructed for a magnetic disk. For the same constituents of this system shown in FIG. 2 as those of the prior art disk control system shown in FIG. 1, the same numeral is given without its detail explanation.

In the disk control system according to the present embodiment shown in FIG. 2, the constituent of the disk control system which differs from the prior art disk control system is an I/O port 9 located between a SCSI control circuit 7 and a SCSI bus 13. That is, the SCSI bus 13 is connected to the I/O port 9 which is connected to the SCSI control circuit 7 through a bus 16. Also, to the I/O port 9 is connected a system controller bus 14 so as to input the control signal of a system controller 11 through the system controller bus 14.

Next, the operation of the disk control system constructed as aforementioned according to the embodiment of the present invention will be described.

First, after the power switch was turned on, the system controller 11 will execute the self-diagnosis mode. The system controller 11 sets up the I/O port 9 to intercept the SCSI bus 13. Thus, it is not necessary to waste time for responding to the self-diagnostic operation after the host system accessed to the disk control system because the self-diagnosis has already been made at the time of power on as mentioned above. Therefore, any error such as time-out and the like may not occur. Subsequently, the operation of the SCSI control circuit 7 is executed through I/O port 9.

For diagnosis of data transmission operation, the system controller 11 set up the SCSI control circuit 7 to the data transmission mode. Then, the system controller 11 reads data read from a main memory 12 and transfers it to the buffer memory 5 through both the I/O port 9 and the SCSI control circuit 7 for storage in the main buffer 5. The system controller 11 reads the content of the buffer memory 5 through the buffer memory control circuit 6 and confirms that data transmitted from the main memory 12 is consistent with data read from the buffer memory 5.

For diagnosis of data receiving operation, the system controller 11 sets up the SCSI control circuit 7 to the data reception mode. Then, the system controller 11 stores reads data from the main memory 12 and transfers it to the buffer memory 5 through the buffer memory control circuit 6 and stores it in the buffer memory 5. Since the SCSI control circuit 7 transmits data stored in the buffer memory 5 to the I/O port 9 through the bus 16 whenever data is stored in the buffer memory 5, the system controller 11 can receive data stored in the buffer memory 5 through the SCSI control circuit 7 once the system controller 11 reads the data transferred through the I/O port 9. Then, the system controller 11 confirms that this transmitted data is consistent with data stored in the main memory 12.

Through these diagnostic functions, the disk control system according to the embodiment can perform the self-diagnosis of the SCSI control circuit 7.

FIG. 3 is a block diagram showing a disk control system according to the second embodiment of the present invention. The difference of the disk control system of this embodiment from that of the first embodiment shown in FIG. 2 is the addition of a DMA controller 15 connected to the system controller bus 14. The remaining parts of this embodiment are essentially the same as the first embodiment of FIG. 2. Therefore, constituents of the system in FIG. 3 which are the same as those shown in FIG. 2 are indicated by the same numeral without giving detail explanation.

In the disk control system according to this embodiment, data transmission between the I/O port 9 and the main memory 12 is executed by the DMA controller 15. By this way, a burden of the system controller 11 may be reduced since data transmission between the I/O port 9 and the main memory 12 is executed without involvement of the system controller 11.

What is claimed is:

1. A disk control system which controls data input and output between a host system and a disk storage device, the control system comprising:

A SCSI (Small Computer System Interface) control circuit which performs SCSI communication with said host system; and input/output (I/O) means, having a first I/O port connected to the host system via a first bus, a second I/O port connected to a second bus, the second bus being independent of the first bus, and a third I/O port connected to a third bus, the I/O means having a first mode for interrupting the SCSI communication between said SCSI control circuit and said host system, irrespective of an active operational mode of the SCSI control circuit for data transmission and data reception, such that the I/O means functions as an input/output circuit for said SCSI control circuit to input and output data to and from the SCSI control circuit from the third bus using the second bus when the SCSI communication between said SCSI control circuit and said host system is interrupted, and a second mode for establishing a connection between the first bus and the SCSI control circuit to permit communication between the host system and the SCSI control circuit.

2. A disk control system according to claim 1, further comprising:

a main memory;

a buffer memory; and self-diagnostic means for setting said SCSI control circuit in a data transmission mode, transferring data stored in the main memory to the buffer memory through said SCSI control circuit and the second bus and comparing data stored in said main memory with data transferred to said buffer memory while the SCSI communication with the host system is interrupted.

3. A disk control system according to claim 1, further comprising self-diagnostic means for setting said SCSI control circuit in a data reception mode, transferring data stored in said buffer memory to said main memory through said SCSI control circuit and the second bus and comparing data stored in said buffer memory with data transferred to said main memory while the SCSI communication with the host system is interrupted.

4. A disk control system according to claim 1, further comprising;

a first memory device;

a second memory device; and self-diagnostic means for setting said SCSI control circuit to a data transmission mode, transferring data stored in the first memory device to the second memory device through said SCSI control circuit and the second bus and comparing data stored in said first memory device with data transferred to said second memory device while the SCSI communication with the host system is interrupted, and for setting said SCSI control circuit to a data reception mode, transferring data stored in said second memory device to said first memory device through said SCSI control circuit and the second bus and comparing data stored in said second memory device with data transferred to said first memory device while the SCSI communication with the host system is interrupted.

5. A disk control system according to claim 1, wherein said disk storage device is an optical disk.

6. A disk control system according to claim 1, wherein said disk storage device is a magnetic disk.

7. A disk control system which controls data input and output between a host system and a disk storage device, the control system comprising;

a SCSI (Small Computer System Interface) control circuit which performs SCSI communication with said host system;

a SCSI bus connected to said host system;

an I/O port interconnected between said SCSI bus and said SCSI control circuit, the I/O port having a first mode for interrupting communication between said SCSI control circuit and said host system while allowing the SCSI control circuit to operate in one of a data transmission mode and a data reception mode and functioning as the input/output circuit for said SCSI control circuit when the I/O port is in said first mode, a system controller bus connected to said SCSI control circuit and said I/O port; and a system controller connected to said system controller bus to set up said SCSI control circuit to operate in the data transmission mode or the data reception mode and to set said I/O port to the first mode through said system controller bus.

8. A disk control system which controls data input and output between a host system and a disk storage device, the control system comprising;

a SCSI (Small Computer System Interface) control circuit which performs SCSI communications with said host system;

a SCSI bus connected to said host system;

an I/O port having a first port connected to said SCSI bus and a second port connected to said SCSI control circuit to selectively permit transmission of data between the SCSI bus and the SCSI control circuit;

a system controller bus connected to said SCSI control circuit and to a third port of said I/O port;

a buffer memory;

a buffer memory control circuit, connected between the system controller bus and the buffer memory, for controlling data input and output to and from said buffer memory;

a main memory connected to said system controller bus; and a system controller connected to said system controller bus, the system controller setting up said SCSI control circuit to operate in a data transmission mode or a data reception mode and setting up said I/O port to interrupt the SCSI communications between the host system and the SCSI control circuit, wherein the I/O port functions as an input/output circuit for the SCSI control circuit through the third port of the I/O port when the SCSI communications are interrupted.

9. A disk control system according to claim 8, wherein said system controller;

reads data from said main memory;

transfers the read data through said third port of said I/O port to the SCSI control circuit and from the SCSI control circuit to the buffer memory for storage in the buffer memory while said SCSI control circuit is in the data transmission mode;

reads the data stored in the buffer memory through the buffer memory control circuit; and determines if the data read from the main memory is consistent with the data read from the buffer memory through said buffer memory control circuit as a diagnosis of the disk control system.

10. A disk control system according to claim 8, wherein said system controller:
   reads data from said main memory;
   transfers the read data through said buffer memory control circuit for storage in the buffer memory while said SCSI control circuit is in the data reception mode;
   reads the data stored in said buffer memory through said I/O port; and
   determines if data read through said I/O port from said buffer memory is consistent with data originally read from the main memory.

11. A disk control system according to claim 8, further comprising a DMA controller connected to said system controller bus and capable of controlling data transfer between said third port of said I/O port and the main memory.

* * * * *